United States Patent [19]

Cook, Jr.

[11] 4,096,619
[45] Jun. 27, 1978

[54] SEMICONDUCTOR SCRIBING METHOD

[75] Inventor: Charles R. Cook, Jr., North Palm Beach, Fla.

[73] Assignee: International Telephone & Telegraph Corporation, Nutley, N.J.

[21] Appl. No.: 764,095

[22] Filed: Jan. 31, 1977

[51] Int. Cl.² .............................................. B23P 17/00
[52] U.S. Cl. ........................................ 29/413; 29/580; 204/15; 204/129.65
[58] Field of Search ................ 29/413, 580, 581, 582, 29/583; 204/15, 129.65

[56] References Cited

U.S. PATENT DOCUMENTS

| | | | |
|---|---|---|---|
| 3,054,709 | 9/1962 | Freestone et al. | 29/413 X |
| 3,392,440 | 7/1968 | Yanagawa | 29/413 X |
| 3,954,523 | 5/1976 | Magdo et al. | 204/129.65 X |
| 3,962,052 | 6/1976 | Abbas et al. | 204/129.65 X |
| 3,997,964 | 12/1976 | Holbrook | 29/413 X |
| 3,998,674 | 12/1976 | Cameron et al. | 29/580 X |

FOREIGN PATENT DOCUMENTS 945,735  1/1964  United Kingdom ............ 204/129.65

*Primary Examiner*—Victor A. DiPalma
*Attorney, Agent, or Firm*—John T. O'Halloran; Peter C. Van Der Sluys

[57] ABSTRACT

This relates to the scribing and breaking of a semiconductor wafer into individual dies by anodizing the silicon in regions corresponding to the die boundaries. The regions are selectively anodized, and the anodization is continued until the anodized silicon extends into the semiconductor wafer to a depth that allows easy breakage when the wafer is stressed. To facilitate breakage, the anodized silicon may be removed with hydrofluoric acid.

14 Claims, 10 Drawing Figures

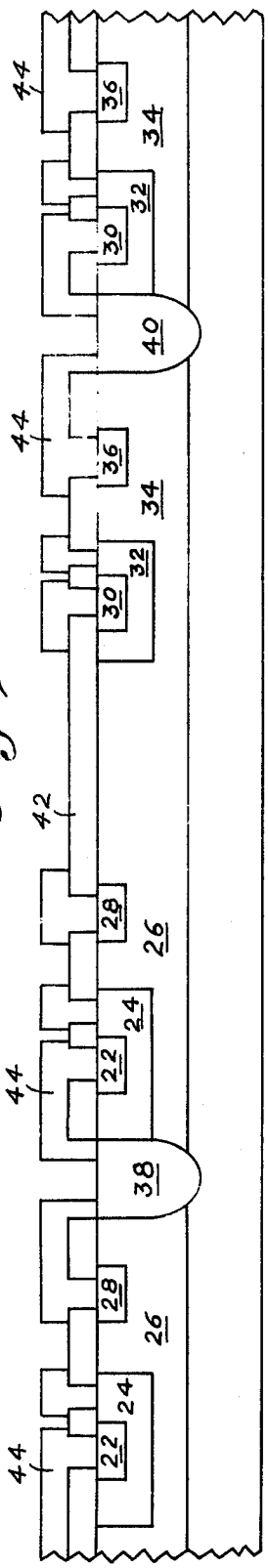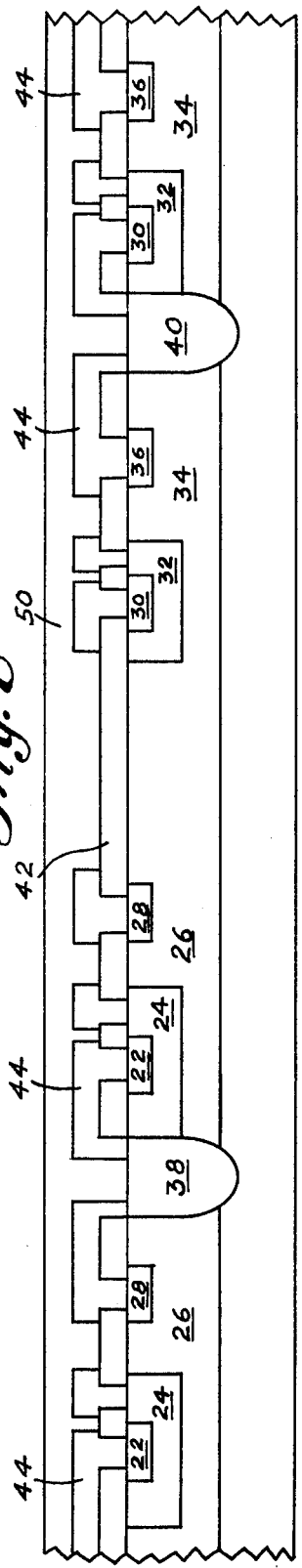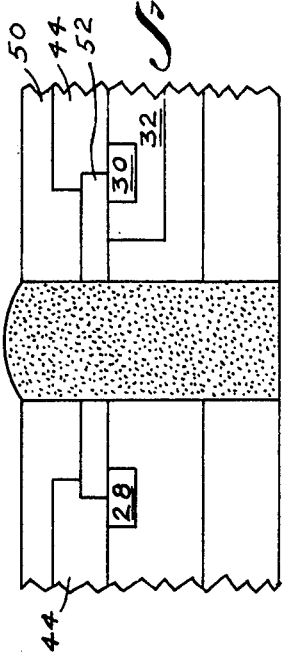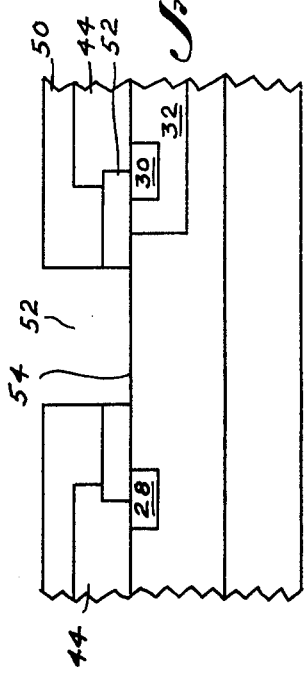

SEMICONDUCTOR SCRIBING METHOD

CROSS REFERENCE TO RELATED APPLICATIONS

This is related to copending application Ser. No. 601,855 entitled "Method for Providing Electrical Isolating Material in Selected Regions of a Semiconductive Material and the Product Produced Thereby" filed Aug. 4, 1975 and assigned to the assignee of the present invention, now abandoned in favor of divisional application Ser. No. 705,632 filed July 15, 1976 and Continuation-in-Part application Ser. No. 780,895 filed Mar. 24, 1977 which applications are hereby incorporated by reference.

BACKGROUND OF THE INVENTION

The present invention relates to semiconductor wafer scribing and, more particularly, to scribing a semiconductor wafer using anodized silicon.

Practically all integrated circuits formed on semiconductor wafers are separated by scribing and breaking the wafer into a plurality of separate die. However, current techniques result in high losses, thereby reducing yield as a result of uneven scribing which causes cracks to form and extend into the individual die.

The technique of laser scribing is an improvement in that no cracks are formed. However, due to non-uniformed planarity throughout the wafer and since the depth of focus of the laser is difficult to control, there results unequal breaking, also reducing the yield. Additionally, laser scribing requires complex equipment and is very expensive.

Saws have also been employed to bring about die separation. This technique, however, presents the same problems as does laser scribing. Further, since sawing is a wet process, it must be performed before the wafer is tested. Breaking is then performed after testing.

Die separation has also been accomplished using a silicon etch. This approach is not suitable because of the difficulty in producing a photoresist which will stand up to the very strong acids used to etch silicon.

SUMMARY OF THE INVENTION

The present invention contemplates the scribing and breaking of a semiconductor wafer into individual die by anodizing the silicon in regions corresponding to desired die boundaries. The regions are selectively anodized, and the anodization is continued until the anodized silicon extends into the semiconductor wafer to a depth that allows easy breakage. Any difficulty in breaking may be overcome by then removing the anodized silicon, leaving a plurality of moats forming a grid-like pattern on the wafer. The anodized silicon is easily removed in hydrofluoric acid.

The anodizing procedure is performed at low temperatures for a short period of time and is therefore not detrimental to the semiconductor material. Further, when anodized silicon isolation techniques are used as disclosed in copending U.S. Pat. application, Ser. No. 601,855 entitled "Method for Providing Electrical Isolating Material in Selected Regions of a Semiconductive Material and the Product Produced Thereby" assigned to the assignee of the present invention, the anodizing step for the formation of the scribing grid moats may be combined with an anodizing step performed during the isolation process. The same is true when contact pads for semiconductor devices are formed by anodizing selected pad regions of semiconductor material to form raised surfaces over the selected pad regions in accordance with copending U.S. Pat. application, Ser. No. 601,856 entitled "Contact Pad for a Semiconductor Device" now abandoned.

It is a primary object of the present invention to provide a method of breaking a semiconductor wafer into a plurality of discrete semiconductor die.

It is a further object of the invention that the method employed for preparing the wafer for subsequent breaking results in a high yield and requires a minimum amount of additional equipment, a minimum additional expense and the least possible stress on the wafer and dies and any circuits or components formed thereon.

According to a broad aspect of the invention, there is provided a method of breaking a semiconductor material in accordance with a desired breakage pattern comprising: anodizing preselected regions of the semiconductor material; and stressing said semiconductor material until said semiconductor material breaks in said regions weakened by the step of anodizing.

The above and other objects of the present invention will be more clearly understood from the following detailed description taken in conjunction with the accompanying drawings in which:

BRIEF DESCRIPTION OF THE DRAWINGS

FIGS. 7–10 are cross-sectional views of a portion of a semiconductor wafer which is to be broken in accordance with the anodized silicon technique wherein each of the circuits to be separated also employs anodized silicon isolation.

DESCRIPTION OF THE PREFERRED EMBODIMENT

Figure 1:
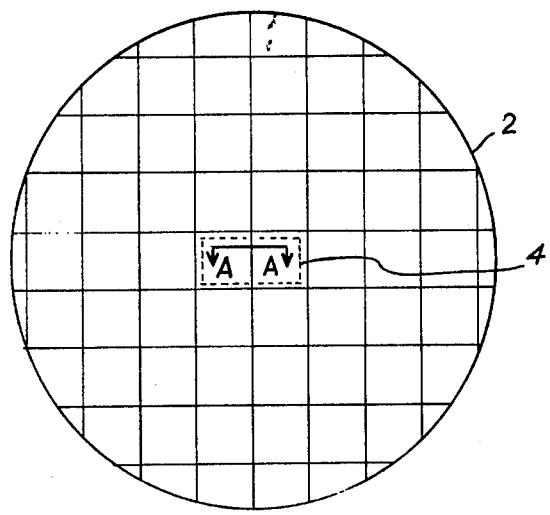
FIG. 1 is a top view of a semiconductor wafer having disposed thereon a pattern which corresponds to desired breakage into individual dies.

Referring to FIG. 1, there is shown a semiconductor wafer having thereon a grid pattern corresponding to the desired breaking pattern of the wafer into individual dies. Clearly, each of the dies may contain any type of semiconductor device normally formed on a semiconductor chip. After testing the wafer, it will be necessary to fracture the wafer 2 along the grind lines including line 6.

Figure 2:
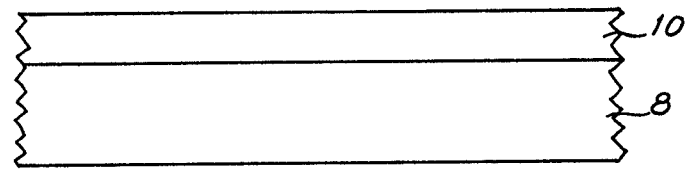
FIGS. 2–4 illustrate various steps in the process of scribing using anodized silicon.
Figure 3:
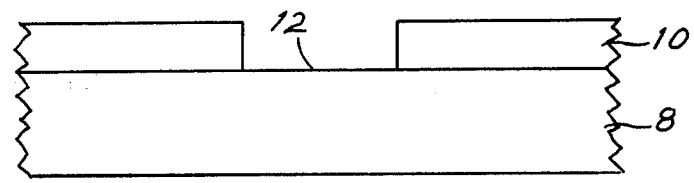

FIG. 2 is a cross-section of that portion of the semiconductor wafer 2 designated as 4 in FIG. 1 taken along line A-A. The semiconductor material 8 shown in FIG. 2 is subjected to an oxidizing process to form a dielectric oxide layer 10 over at least one surface thereof, but preferably over all exposed surfaces. Vapox is suitable for this purpose; however, it should be clear that other dielectric materials may be used. Using a conventional process such as photoetching, selected regions 12 of layer 10 are removed to expose semiconductor material 8 in the selected regions (FIG. 3). These regions correspond, if looked at in their totality, to the grid pattern shown on the wafer 2 in FIG. 1. The remaining portions of dielectric material 10 form a mask as shown in FIG. 3.

Figure 5:
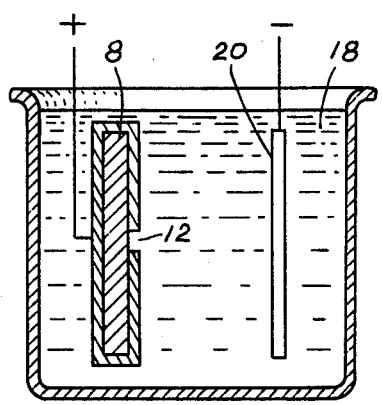
FIG. 5 is a diagrammatic representation of the step of anodization in accordance with the present invention.

Anodization is performed by applying a positive potential directly to the semiconductor material 8 while submerging the entire device in an anodizing solution 18 containing an electrolyte and a cathode 20 as shown in FIG. 5. The semiconductor material 8 in regions 12 form an anode when the positive potential is applied to semiconductor material 8.

Figure 4:
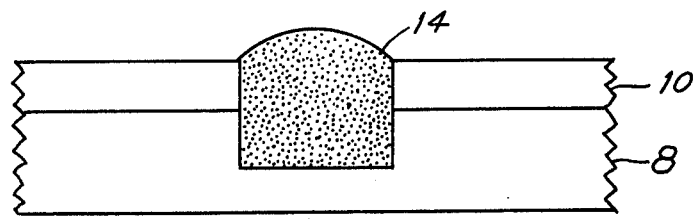

Since the anodization of silicon results in an expansion of the material anodized, the anodized silicon will extend above the upper surface of semiconductor material 8 (FIG. 4). The depth of anodization may be controlled by controlling the window size 12 and/or the length of time during which anodization takes place.

Since it is desired that the wafer break in accordance with the pattern of anodized aluminum as described above with a minimum amount of stress on the wafer, and preferably without removing the anodized material, it is highly desirable that the anodized material be porous. Porous anodized material may be developed in two ways; firstly, the selection of an electrolyte that etches the anodized material to create pores, and secondly by inducing an exothermic reaction that results in a porous anodized material.

In the first method the electrolyte must etch the anodic material at an appreciable rate. A porous anodic material may be formed using almost any electrolyte at the proper temperature and current conditions. For example, the acid concentration in deionized water may be adjusted to obtain 3 amps of current at a voltage of 80 to 120 volts applied to a 1 inch diameter wafer. Anodization is continued until the desired thickness is developed. Electrolytes made from boric, sulfuric, nitric and phosphoric acids and ammonium hydroxide proved to be useful. The results achieved using various types of electrolytes at different temperature and current conditions are described in the above referenced copending U.S. Pat. application, Ser. No. 601,855.

In the second method, the anodizing potential and the resulting current is increased to a level at which an exothermic type of reaction takes place resulting in rapid anodization of the semiconductive material. Apparently, this is the result of an electrical breakdown in the normal anodic film. It was discovered that the exothermic anodization produced a very porous anodic material.

Under proper conditions, the anodization would stop when the depth of the anodized material was approximately equal to the width of the opening in the oxide mask. These proper conditions are interdependent and vary considerably so that the specific conditions for a particular device must be established from empirical data. Alternately, anodization can be terminated by cutting off the potential when the desired thickness has been developed. A time vs. thickness curve could be established from experimental data so that at a selected time the potential may be cut off.

Figure 6:
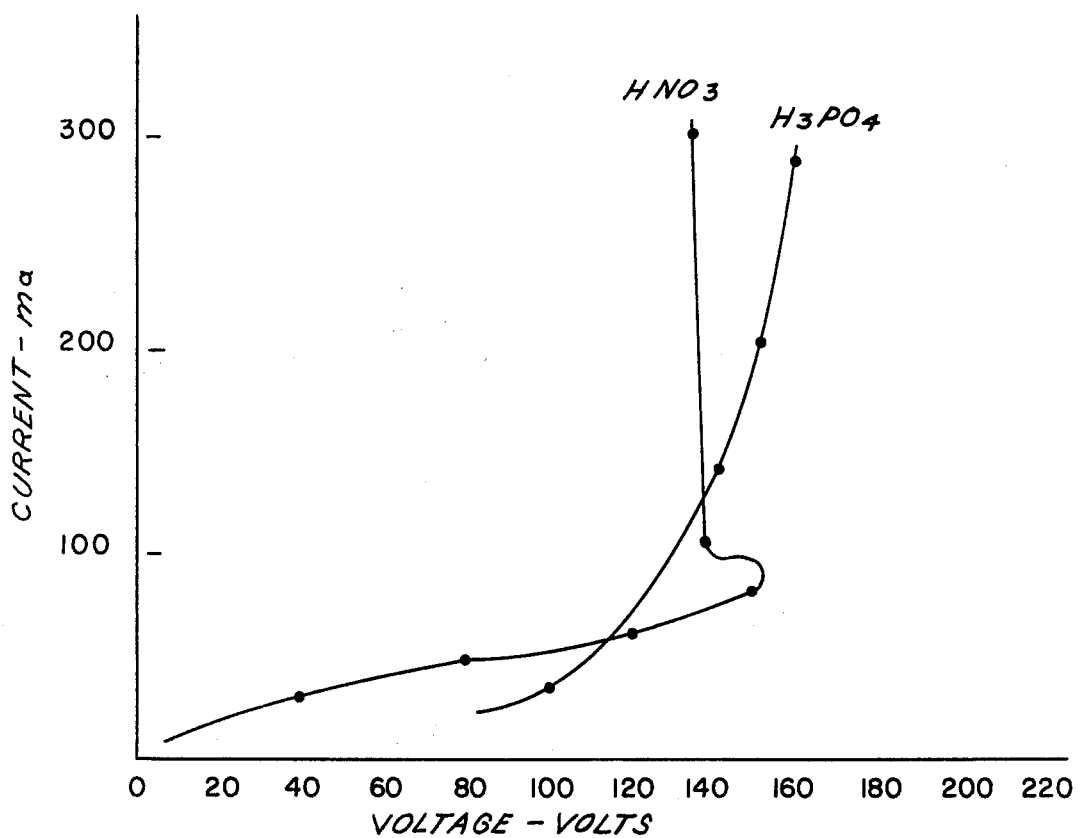
FIG. 6 is a graph showing the voltage current characteristics of two electrolytes at a particular set of anodizing parameters.

Experiments were conducted using electrolytes containing boric, sulfuric, nitric and phosphoric acid. The V/I characteristics for the nitric and phosphoric acid electrolytes are shown in FIG. 6. It is to be noted that for nitric acid a distinct knee is shown in the curve. Below the knee normal controlled anodization is experienced while above the knee the exothermic type of anodization takes place. Since the two modes are distinctly separate and do not merge into each other, anodization can be selected for either the exothermic or normal type without fear of sliding into the fast exothermic type of reaction.

For a broad area of uniform anodization, sufficient current above the knee of the curve must be supplied to electrically break down the anodic film over the entire area. The newly formed anodized layers's impedance should be predominant to all other kind, so that subsequent anodization rates are virtually invarient over the entire submerged area of the wafer. The back side of the wafer should be insulated since anodization of that surface is not desired and would also require considerably more anodizing current and additional power consumption.

The V/I curve for the phosphoric acid electrolyte is smooth and does not contain the characteristic knee of the nitric acid electrolyte; therefore, it was discovered that the fast mode of anodization could easily be induced when the phosphoric acid electrolyte was used. The preferred electrolyte contains a mixture of phosphoric acid in deionized water and anodization is performed at room temperature. It was also found that the phosphoric acid electrolyte provides an even anodization over relatively large areas. Thus, the preferred electrolyte for the formation of contact pads is the phosphoric acid electrolyte since it provides even anodization, may be performed at room temperature, and may be easily induced into the exothermic type of reaction which can typically produce 1 $\mu$m of film per minute.

FIG. 4 illustrates the structure of FIG. 3 after anodization. The anodized material is designated 14 in FIG. 4.

If the anodization of silicon along the desired breakage pattern has not successfully weakened the wafer along the desired pattern such that it may be easily broken by well-known methods, for example rolling, the anodized material may easily be removed by immersion in 10% hydrofluoric acid.

The remaining steps correspond to those conventionally employed in the production of semiconductor devices.

FIG. 7 illustrates a portion of a semiconductor wafer on which two integrated circuits have been formed. For the sake of simplicity, each circuit comprises two transistors. The first circuit contains emitter regions 22, base regions 24, collector regions 26 and collector contact elements 28. The second circuit comprises emitter regions 30, base regions 32, collector regions 34 and collector contact elements 36. It will also be noted that each transistor in each individual circuit has been electrically isolated using the anodized silicon isolation techniques described in the above referenced copending U.S. Pat. application, Ser. No. 601,855. The anodized isolation regions are designated 38 and 40 respectively in FIG. 7. Also shown in FIG. 7 is a layer of dielectric material 42 having windows therein corresponding to a desired contact pattern. Also, metal contacts 44 have been disposed over the contact regions. The wafer may now be tested.

After testing, a layer of Vapox 50 is shown disposed over the entire wafer as shown in FIG. 8. Using standard etching techniques, window 52 is opened through Vapox layer 50 and dielectric layer 42 exposing the surface 54 of the silicon body (FIG. 9). Then, as shown in FIG. 10 and in accordance with the technique described above, the silicon beneath window 52 is anodized to a depth which will result in easy breakage and separation into two individual integrated circuits when the wafer is stressed. While only two integrated circuits have been shown, it should be clear that the technique as described pertains to the separation of all dies comprising the semiconductor wafer shown in FIG. 1.

It has been found that if the anodization takes place in boric acid, the depth of anodization is in some way proportional to the window opening. Therefore, it should be clear that the anodization in the scribing regions may take place simultaneously with the forming of isolation regions on individual dies. By merely using a wider window above the scribing regions than above the isolation regions the silicon in the scribing regions will be anodized to a greater depth. Nevertheless, it should be clear that the anodization of silicon in the scribing regions may take place at almost any step in the manufacturing process.

Thus, the present invention provides an inexpensive and convenient method of breaking semiconductor wafers into individual dies While the principles of this invention have been described above in connection with specific apparatus, it is to be understood that this description is made only by way of example and not as a limitation on the scope of the invention as set forth in the objects and features thereof and in the accompanying claims.

What is claimed is:

1. A method of breaking a semiconductor material in accordance with a desired breakage pattern comprising:
   anodizing preselected regions of the semiconductor material; and
   stressing said semiconductor material until said semiconductor material breaks in said regions weakened by the step of anodizing.

2. A method according to claim 1 further including removing the anodized material prior to breaking.

3. A method according to claim 1 wherein said semiconductor material is silicon.

4. A method of breaking a semiconductor wafer into a pluralityu of individual semiconductor dies comprising:
   anodizing said wafer along selected regions to a predetermined depth; and
   stressing said wafer until said wafer breaks along said selected regions.

5. A method according to claim 4 further including removing the anodized silicon with hydrofluoric acid prior to stressing.

6. A method of scribing a semiconductor wafer comprising:
   forming a protective insulating layer on the surface of said wafer;
   removing preselected portions of said insulating layer forming windows which expose said wafer in the regions to be scribed;
   anodizing said exposed semiconductor material to a predetermined depth; and
   stressing said wafer until said wafer breaks along said preselected regions.

7. A method according to claim 6 further including removing the anodized silicon prior to stressing, thereby forming a pattern of moats which create regions of reduced strength in the wafer for easy breakage.

8. A method according to claim 6 wherein said predetermined depth is related to said window size.

9. A method according to claim 6 wherein the insulating layer is formed by oxidization of the semiconductor wafer.

10. A method according to claim 9 wherein said insulating layer is vapox.

11. A method according to claim 6 wherein the anodizing step comprises:
    submerging the semiconductor wafer into an anodizing solution; and
    applying an anodizing potential to the semiconductor material so that the exposed regions become an anode.

12. A method according to claim 11 wherein the anodizing solution contains an acid.

13. A method according to claim 11 wherein the anodizing solution is selected from a group including sulfuric, phosphoric, boric and nitric acid solutions.

14. A method according to claim 11 wherein said anodizing potential causes an exothermic reaction.

* * * * *